(12) United States Patent
Wang et al.

(10) Patent No.: US 11,972,940 B2
(45) Date of Patent: Apr. 30, 2024

(54) AREA SELECTIVE CARBON-BASED FILM DEPOSITION

(71) Applicant: Applied Materials, Inc., Santa Clara, CA (US)

(72) Inventors: Xinke Wang, Singapore (SG); Bhaskar Jyoti Bhuyan, San Jose, CA (US); Zeqing Shen, San Jose, CA (US); Susmit Singha Roy, Campbell, CA (US); Abhijit Basu Mallick, Sunnyvale, CA (US); Jiecong Tang, Singapore (SG); John Sudijono, Singapore (SG); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/722,648

(22) Filed: Apr. 18, 2022

(65) Prior Publication Data

US 2023/0335391 A1    Oct. 19, 2023

(51) Int. Cl.
*H01L 21/02* (2006.01)
*C23C 16/04* (2006.01)
(Continued)

(52) U.S. Cl.
CPC ........ *H01L 21/02118* (2013.01); *C23C 16/04* (2013.01); *C23C 16/26* (2013.01);
(Continued)

(58) Field of Classification Search
CPC ........... H01L 21/0228; H01L 21/02107; H01L 21/28194; H01L 21/3141; H01L 21/28562;
(Continued)

(56) References Cited

U.S. PATENT DOCUMENTS 7,214,600 B2    5/2007   Won et al.
11,120,995 B2   9/2021   Hsu et al.
(Continued)

FOREIGN PATENT DOCUMENTS

CN    113838744    * 12/2021
JP    2019212776 A   12/2019
(Continued)

OTHER PUBLICATIONS

PCT International Search Report and Written Opinion in PCT/US2021/042663 dated Nov. 10, 2021, 12 pages.
(Continued)

*Primary Examiner* — Tabassom Tadayyon Eslami
(74) *Attorney, Agent, or Firm* — Servilla Whitney LLC

(57) ABSTRACT

Methods of selectively depositing a carbon-containing layer are described. Exemplary processing methods may include flowing a first precursor over a substrate comprising a metal surface and a non-metal surface to form a first portion of an initial carbon-containing film on the metal surface. The methods may include removing a first precursor effluent from the substrate. A second precursor may then be flowed over the substrate to react with the first portion of the initial carbon-containing layer. The methods may include removing a second precursor effluent from the substrate. The methods may include pre-treating the metal surface of the substrate to form a metal oxide surface on the metal surface.

7 Claims, 3 Drawing Sheets

(51) Int. Cl.
    *C23C 16/26*     (2006.01)
    *C23C 16/56*     (2006.01)

(52) U.S. Cl.
    CPC ........ *C23C 16/56* (2013.01); *H01L 21/02205* (2013.01); *H01L 21/0228* (2013.01); *H01L 21/02304* (2013.01)

(58) Field of Classification Search
    CPC .............. H01L 41/47; H01L 21/02115; H01L 21/02118; H01L 21/76801; H01L 21/0251; C23C 16/04; C23C 16/45525; C23C 16/45553
    See application file for complete search history.

(56) References Cited

U.S. PATENT DOCUMENTS

| | | |
|---|---|---|
| 2016/0060754 A1 | 3/2016 | Noh et al. |
| 2016/0343580 A1 | 11/2016 | Hudson |
| 2017/0352533 A1* | 12/2017 | Tois ................. H01L 21/76834 |
| 2017/0352550 A1 | 12/2017 | Tois et al. |
| 2018/0342388 A1 | 11/2018 | Chakraborty et al. |
| 2019/0294046 A1 | 9/2019 | Nishimaki et al. |
| 2019/0368034 A1 | 12/2019 | Liu et al. |
| 2021/0175092 A1 | 6/2021 | Tois et al. |
| 2021/0277516 A1 | 9/2021 | Bhuyan et al. |
| 2022/0028686 A1 | 1/2022 | Bhuyan et al. |
| 2022/0131096 A1* | 4/2022 | Wang .................... H10K 10/50 |

FOREIGN PATENT DOCUMENTS

| | | |
|---|---|---|
| KR | 20020043702 A | 6/2002 |
| WO | 2019173074 A2 | 9/2019 |

OTHER PUBLICATIONS

Zhang, Chao, et al., "Area-Selective Molecular Layer Deposition of Polyimide on Cu through Cu-Catalyzed Formation of a Crystalline Interchain Polyimide", Chem. Mater. 2020, 32, 5073-5083.

PCT International Search Report and Written Opinion in PCT/US2023/018309 dated Jul. 28, 2023, 11 pages.

* cited by examiner

AREA SELECTIVE CARBON-BASED FILM DEPOSITION

TECHNICAL FIELD

Embodiments of the disclosure relate to methods for selectively depositing a carbon-based film. In particular, embodiments of the disclosure are directed to methods of depositing carbon-based layers selectively on metal surfaces over non-metal surfaces.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

The semiconductor industry faces many challenges in the pursuit of device miniaturization which involves rapid scaling of nanoscale features. Such issues include the introduction of complex fabrication steps such as multiple lithography steps and integration of high-performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Area-selective atomic layer deposition (AS-ALD) can be used for selective deposition of material. During AS-ALD, when the deposited ALD film becomes thicker than the self-assembled monolayers (SAM) used to passivate non-growth surfaces, the ALD film may grow sideways (which may be referred to as mushrooming), thus reducing selectivity. There is an ongoing need in the art, therefore, for methods to improve deposition selectivity and to avoid the problems encountered during AS-ALD.

SUMMARY

One or more embodiments of the disclosure are directed to a method of depositing a film. A method of selectively depositing a film comprises: flowing a first precursor over a substrate comprising a metal surface and a non-metal surface to form a first portion of a carbon-containing layer on the metal surface, the first precursor comprising a first reactive group; removing a first precursor effluent comprising the first precursor from the substrate; flowing a second precursor comprising a second reactive group over the substrate to react with the first reactive group to form the carbon-containing layer on the metal surface of the substrate and not on the non-metal surface; and removing a second precursor effluent comprising the second precursor from the substrate.

Another embodiment of the disclosure is directed to a method of selectively depositing a film. In one or more embodiments, a method of selectively depositing a film comprises: flowing a first precursor over a substrate comprising a metal surface and a non-metal surface, the first precursor having a general formula $R^1$—$(X)_n$ wherein $R^1$ comprises one or more of an alkyl group, an alkenyl group, an aryl or aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the first precursor reacts with a reactive group on the metal surface to form a first portion of a carbon-containing layer on the metal surface; removing a first precursor effluent comprising the first precursor from the substrate; flowing a second precursor over the substrate, the second precursor having a general formula $R^2$—$(Y)_n$ wherein $R^2$ comprises one or more of an alkyl group, an alkenyl group, an aryl or an aromatic group, and a cycloalkyl group, $Y_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the second precursor reacts with the first portion to form the carbon-containing layer; and removing a second precursor effluent comprising the second precursor from the substrate.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
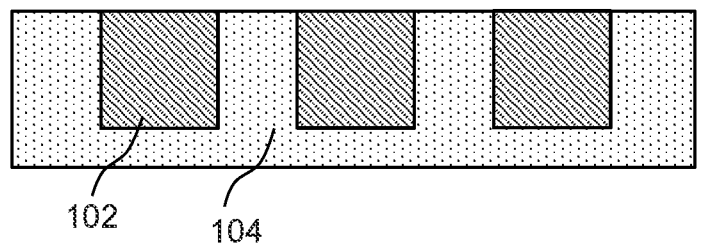
FIG. 1A illustrates cross-section view of a substrate according to one or more embodiments.

Before describing several exemplary embodiments of the invention, it is to be understood that the invention is not limited to the details of construction or process steps set forth in the following description. The invention is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate. Substrates may have various dimensions, such as 200 mm or 300 mm diameter wafers, as well as rectangular or square panes. In some embodiments, the substrate comprises a rigid discrete material.

The term "on" indicates that there is direct contact between elements. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

As used in this specification and the appended claims, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

Carbon-containing materials may be used in semiconductor device manufacturing for a number of structures and processes, including as a mask material, an etch resistant material, and a trench fill material, among other applications. More specific examples of applications for carbon-containing materials include the formation of hot implant hard masks, metal gate (MG)-cut hard masks, metal gate fabrication, and reverse tone patterning, self-aligned patterning, among others. The present technology includes the selective formation of these carbon-containing materials on metal/metallic surfaces using molecular layer deposition (MLD).

Embodiments of the present technology include molecular layer deposition (MLD) methods and systems to selectively form a carbon-containing material on a metal/metallic surface. Exemplary MLD methods may include providing a first deposition precursor to a metal/metallic surface of a semiconductor substrate, where the precursor forms a first layer (e.g., a first monolayer) on surfaces. During or after the formation of the first layer, unbound deposition effluents, which may include unbound molecules of the first deposition precursor, are removed from a processing region in which the semiconductor substrate is exposed. A second deposition precursor may then be introduced to the semiconductor substrate, where molecules of the second deposition precursor bind to reactive moieties on the first layer to form a second layer (e.g., a second monolayer) on the metal/metallic surface and not or much less on the non-metal surface. During or after the formation of the second layer, unbound deposition effluent, which may include unbound molecules of the second deposition precursor, are removed from the processing region. The semiconductor substrate now has a carbon containing material layer bound to the metal/metallic surface of the semiconductor substrate, and no or less carbon containing material deposited on non-metal surface. Additional compound layers of first and second layers may be built up on the deposited layers until the number of built-up compound layers reaches a desired thickness of carbon-containing material on the metal/metallic surface of the semiconductor substrate. The compound layers may then be annealed, or plasma treated to form the carbon-containing material on the metal/metallic surface of the semiconductor substrate.

One or more embodiments advantageously provides solutions to problems with conventional methods of forming a carbon-containing material on a semiconductor substrate. For example, the present technology forms a carbon-containing material with significantly fewer voids, fractures, and other physical defects than carbon-containing materials formed using spin-on-carbon (SOC) and flowable chemical-vapor-deposition (FCVD) methods. The present technology may also form carbon-containing materials with higher density and lower porosity than materials formed with SOC and FCVD. The high levels of hydrogen found in many SOC and FCVD precursors result in high levels of shrinkage when the as-deposited materials are treated to form a final material. Shrinkage as high as 50 vol. % is not uncommon for as-deposited SOC and FCVD materials following treatment, which creates gaps, fractures, and voids in treated material, as well as stresses on substrate features in contact with the material. The present technology produces treated carbon-containing materials with less than 10 vol. % shrinkage of the as-deposited material (e.g., 5-10 vol. % shrinkage, less than about 5 vol. % shrinkage).

One or more embodiments advantageously provides solutions to problems with conventional plasma deposition methods of forming a carbon-containing material on a semiconductor substrate. Conventional plasma deposition methods such as plasma-enhanced chemical-vapor-deposition (PECVD) and high-density-plasma chemical-vapor-deposition (HDPCVD) often create ion sputtering that causes damage to substrate features on the semiconductor substrate and can also create re-sputtered ions and other species that can cause defects in the deposited carbon-containing material. In addition, they often deposit the material unevenly in and around substrate features, creating voids in and around substrate trenches and steps, and uneven surfaces in planar substrate regions. The present technology may form carbon-containing materials with a high level of conformity in narrow substrate features (e.g., dimension widths less than about 25 nm) and high aspect ratios (e.g., AR of 10:1 or more) without the need for plasmas that can damage the substrate feature during deposition.

The embodiments of the disclosure are described by way of the Figures, which illustrate devices (e.g., transistors) and processes for forming semiconductor structures in accordance with one or more embodiments of the disclosure. The processes shown are merely illustrative possible uses for the disclosed processes, and the skilled artisan will recognize that the disclosed processes are not limited to the illustrated applications.

FIGS. 1A-1D illustrate cross-sectional views of a semiconductor substrate being processed according to the method of one or more embodiments. FIG. 2 illustrates a process flow diagram of a method 200 of selectively depositing a film according to one or more embodiments. Referring to FIGS. 1A-1D and FIG. 2, in one or more embodiments, at operation 202, a substrate is provided. As used in this specification and the appended claims, the term "provided" means that the substrate is made available for processing (e.g., positioned in a processing chamber).

Figure 2:
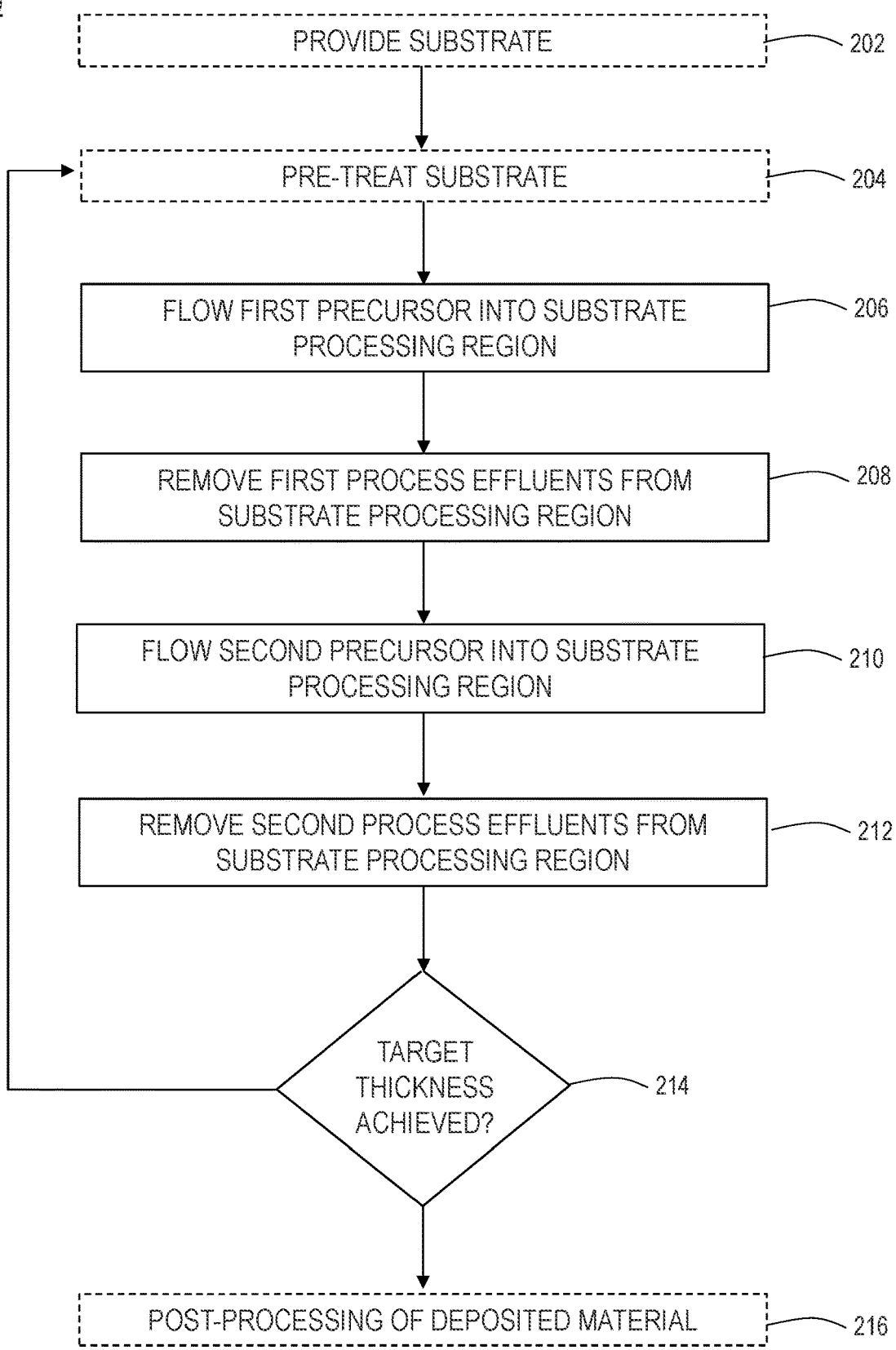
FIG. 2 illustrates a process flow diagram of a method of selectively depositing a film on a substrate according to one or more embodiments.

Referring to FIG. 1A, in one or more embodiments, a substrate includes a metal surface 102 and a non-metal surface 104. In some embodiments, the non-metal 104 comprise a dielectric surface. In other embodiments, the non-metal surface 104 comprises one or more of a dielectric surface, a semiconductor surface, a non-metal surface, or a metal surface where the metal is different from the metal of the metal surface 102. It will be appreciated by one of skill in the art that the carbon containing layer has growth only on certain metal surfaces, while no growth or much less growth on other second surfaces. The selectivity (the ratio of thickness on different surfaces) can be 2:1, 5:1, 10:1, 50:1, 100:1, or absolute selective growth (no growth on undesired surface).

In one or more embodiments, the substrate on which the carbon-containing material is selectively formed may include a material in which one or more features may be formed. The substrate features may be characterized by any shape or configuration according to the present technology. In some embodiments, the features may be or include a trench structure, a via structure, or aperture formed within the substrate. Although the substrate features may be characterized by any shapes or sizes, in some embodiments the substrate features may be characterized by higher aspect ratios, or a ratio of a depth of the feature to a width across the feature. For example, in some embodiments substrate features may be characterized by aspect ratios greater than or equal to 5:1, and may be characterized by aspect ratios greater than or equal to 10:1, greater than or equal to 15:1, greater than or equal to 20:1, greater than or equal to 25:1, greater than or equal to 30:1, greater than or equal to 40:1, greater than or equal to 50:1, or greater. Additionally, the features may be characterized by narrow widths or diameters across the feature including between two sidewalls, such as a dimension less than or equal to 20 nm, and may be characterized by a width across the feature of less than or equal to 15 nm, less than or equal to 12 nm, less than or equal to 10 nm, less than or equal to 9 nm, less than or equal to 8 nm, less than or equal to 7 nm, less than or equal to 6 nm, less than or equal to 5 nm, or less.

A "metal," as used herein, refers to metal, metallic, metal alloy, metal oxide, metal nitride, or combination thereof. A "metal surface", as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate. In addition to the pretreatment directly on the metal surface itself, in the present disclosure, any of the metal surface treatment disclosed may also be performed on an underlayer metal surface as disclosed in more detail below, and the term "metal surface" is intended to include such underlayer as the context indicates. Thus, for example, where a film/layer or partial film/layer has been deposited onto the metal surface, the exposed surface of the newly deposited film/layer becomes the metal surface.

In one or more embodiments, the metal surface 102 comprises a metal, a metal alloy, a metal oxide, a metal nitride, or a combination thereof. Non-limiting examples of metal include copper (Cu), cobalt (Co), nickel (Ni), tungsten (W), ruthenium (Ru), chromium (Cr), iron (Fe), platinum (Pt), gold (Au), silver (Ag), molybdenum (Mo), gallium (Ga), indium (In), tungsten (W), titanium (Ti), tantalum (Ta), aluminum (Al), nickel (Ni), oxides thereof, or combinations thereof. In one or more specific embodiments, the metal surface 102 comprises one or more of copper (Cu), cobalt (Co), ruthenium (Ru), tungsten (W), molybdenum (Mo), titanium nitride (TiN), tantalum nitride (TaN), titanium (Ti), tantalum (Ta), aluminum (Al), nickel (Ni), or oxides thereof.

A "dielectric surface," as used herein, refers to any portion of a substrate or portion of a material surface formed with the dielectric material. Non-limiting examples of dielectric material include silicon oxide ($SiO_x$), silicon nitride ($Si_xN_y$), silicon (Si), silicon oxynitride (SiON), carbides, oxycarbides, nitrides, oxynitrides, oxycarbonitrides, polymers, phosphosilicate glass, fluorosilicate (SiOF) glass, organosilicate glass (SiOCH), aluminum oxide ($AlO_x$), hafnium oxide ($HfO_x$), zirconium oxide ($ZrO_2$), titanium oxide ($TiO_x$), titanium nitride (TiN), tantalum oxide ($Ta_xO_5$), yttrium oxide ($Y_2O_3$), lanthanum oxide ($La_2O_3$), aluminum nitride (AlN), magnesium oxide (MgO), calcium fluoride ($CaF_2$), lithium fluoride (LiF), strontium oxide (SrO), silicon carbide (SiC), barium oxide (BaO), hafnium silicate ($HfSiO_4$), lanthanum aluminate ($LaAlO_3$), niobium pentoxide ($Nb_2O_5$), barium titanate ($BaTiO_3$), strontium titanate ($SrTiO_3$), bismuth titanate ($Bi_4Ti_3O_{12}$), lead zirconium titanate ($Pb(Zr, Ti)O_3$), calcium copper titanate ($CaCu_3Ti_4O_{12}$), lithium niobate ($LiNbO_3$), barium titanate ($BaTiO_3$), and potassium niobate ($KNbO_3$). In one or more specific embodiments, the non-metal surface 104 comprises one or more of silicon oxide ($SiO_x$), silicon oxycarbide (SiOC), silicon oxycarbonitride (SiOCN), silicon nitride (SiN), silicon oxynitride (SiON), silicon (Si), germanium (Ge), silicon germanium (SiGe), silicon carbide (SiC), indium gallium zinc oxide (InGaZnO), aluminum oxide ($AlO_x$), aluminum nitride (AlN), and hafnium oxide ($HfO_x$).

In one or more embodiments, at operation 204, the non-metal surface 104 may optionally be exposed to a pretreatment process to polish, coat, dope, etch, reduce, oxidize, hydroxylate, anneal, UV cure, e-beam cure and/or bake the substrate. In addition to the pretreatment directly on the non-metal surface 104 itself, in the present disclosure, any of the treatments or pre-treatments disclosed may also be performed on an underlayer metal surface as disclosed in more detail below, and the term "dielectric surface" is intended to include such underlayer as the context indicates. Thus, for example, where a film/layer or partial film/layer has been deposited onto the metal surface, the exposed surface of the newly deposited film/layer becomes the metal surface.

In one or more embodiments, the substrate is pre-treated with one or more of high temperature annealing, plasma treatment, and gas annealing. Plasma treatment may include treatment with a plasma selected from one or more of hydrogen ($H_2$), oxygen ($O_2$), ammonia ($NH_3$), nitrogen ($N_2$), carbon dioxide ($CO_2$), nitrous oxide ($N_2O$), argon (Ar), and the like. Gas annealing may include annealing in an atmosphere of one or more of hydrogen ($H_2$), oxygen ($O_2$), ozone ($O_3$), nitrous oxide ($N_2O$), water ($H_2O$), hydrogen peroxide ($H_2O_2$), and the like.

In one or more embodiments, the pre-treatment process of operation 204 removes layers from substrate. In some embodiments, the pre-treatment process of operation 204 creates metal oxide layers on metal surfaces 102. In one or more embodiments, the pre-treatment process of operation 204 is critical to form a metal oxide on the metal surface, enabling selective molecular layer deposition (MLD) on the metal surface.

In some embodiments, the metal surface 102 is cleaned/pre-treated with a plasma. In some embodiments, the plasma is a conductively coupled plasma (CCP). In some embodiments, the plasma is an inductively coupled plasma (ICP).

As used in this specification and the appended claims, the phrase "selectively over," or similar phrases, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface.

In one or more embodiments, a carbon-containing layer 114 forms on the metal/metallic surface 102 and not on the non-metallic surface 104 with a selectivity ratio of at least 10:1, or at least 100:1, or at least 1000:1.

Figure 1B:
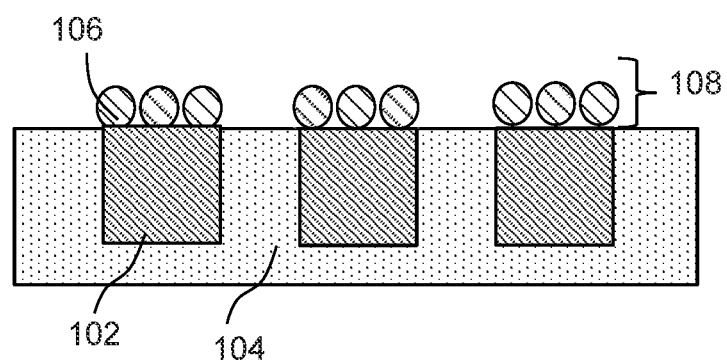
FIG. 1B illustrates cross-section view of a substrate according to one or more embodiments.

With reference to FIG. 1B and FIG. 2, at operation 206, a first type of precursor 106 is introduced/flowed into the substrate processing region of a processing chamber and over the substrate surface. The first precursor 106 binds strongly to the metal surface 102, while not binding to the non-metal surface 104.

In one or more embodiments, the first precursor 106 may be a carbon-containing precursor that has at least two reactive groups that can form a bond with a group attached to the metal surface 102 of a substrate. Molecules of the first precursor 106 react with the surface groups, e.g., metal ions, of the metal surface 102 to form bonds linking the first precursor 106 molecule to the metal surface 102 of the substrate. The reactions between the first precursor 106 molecules and the groups on the metal surface 102 of the substrate continue until most or all the surface groups are bonded to a reactive group on the first precursor 106 molecules. A first portion 108 of a carbon-containing layer 114 is formed that blocks further reaction between first precursor 106 molecules in the first precursor effluent and the substrate.

The first precursor 106 may comprise any suitable precursor known to the skilled artisan. In one or more embodiments, the first precursor 106 may have a general formula $R^1-(X)_n$ wherein n is an integer in a range of from 1 to 6, and $R^1$ comprises one or more of an alkyl group, an alkenyl group, an aryl, or aromatic group, and a cycloalkyl group. $X_n$ comprises one or more of a hydroxide group, an aldehyde group, a ketone group, an acid group, an amino group, an isocyanate group, a thiocyanate group, and an acyl chloride group.

Unless otherwise indicated, the term "lower alkyl," "alkyl," or "alk" as used herein alone or as part of another group includes both straight and branched chain hydrocarbons, containing 1 to 20 carbons, or 1 to 10 carbon atoms, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

Such alkyl groups may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloalkylalkyloxy, amino, hydroxy, hydroxyalkyl, acyl, heteroaryl, heteroaryloxy, heteroarylalkyl, heteroarylalkoxy, aryloxyalkyl, alkylthio, arylalkylthio, aryloxyaryl, alkylamido, alkanoylamino, arylcarbonylamino, nitro, cyano, thiol, haloalkyl, trihaloalkyl, and/or alkylthio, and the like. In one or more embodiments, $R^1$ is independently selected from $C_{1-20}$ alkyl. In other embodiments, $R^1$ is from $C_{1-12}$ alkyl.

As used herein, the term "alkene" or "alkenyl" or "lower alkenyl" refers to straight or branched chain radicals of 2 to 20 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein.

As used herein, the term "alkynyl" or "lower alkynyl" refers to straight or branched chain radicals of 2 to 20 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

The term "halogen" or "halo" as used herein alone or as part of another group refers to chlorine, bromine, fluorine, and iodine as well as $CF_3$.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

Without intending to be bound by theory, it is thought that the metal surface 102 includes metal ions like, e.g., $Cu^+$ or $Cu^{2+}$, that act as a catalyst to speed up the reaction or generate a new reaction between two precursors on the metal surface to form a first portion of an initial carbon-containing film on the metal surface. In one or more embodiments, pre-treating the metal surface 102 to form a metal oxide surface may generate metal ions that are critical to selective deposition of the carbon-containing layer 114.

Specific examples of first precursor 106 include, but are not limited to, one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-oxydianiline, tris(2-aminoethyl) amine, and the like.

In one or more embodiments, the formation rate of the first portion of the carbon-containing film may depend on the temperature of the substrate as well as the temperature of the deposition precursors that flow into the substrate processing region. Exemplary substrate temperatures during the formation operations may be greater than or equal to 50° C., greater than or equal to 60° C., greater than or equal to 70° C., greater than or equal to 80° C., greater than or equal to 90° C., greater than or equal to 100° C., greater than or equal to 110° C., greater than or equal to 120° C., greater than or equal to 130° C., greater than or equal to 140° C., greater than or equal to 150° C., or higher. By maintaining the substrate temperature elevated, such as above or about 100° C. in some embodiments, an increased number of nucleation sites may be available along the metal surface 102 of the substrate, which may improve formation and reduce void formation by improving coverage at each location.

The first precursor 106 effluent may remain in the substrate processing region for a period of time to nearly, or completely, form the first portion 108 of the carbon-containing layer 114. The precursors may be delivered in alternating pulses to grow the material. In some embodiments, the pulse times of either or both of the first precursor 106 and the second precursor 110 may be greater than or equal to 0.1 seconds, greater than or equal to 1 second, greater than or equal to 2 seconds, greater than or equal to 3 seconds, greater than or equal to 4 seconds, greater than or equal to 5 seconds, greater than or equal to 10 seconds, greater than or equal to 20 seconds, greater than or equal to 40 seconds, greater than or equal to 60 seconds, greater than or equal to 80 seconds, greater than or equal to 100 seconds, or more.

With reference to FIG. 2, at operation 208, the first precursor 106 is purged or removed from the substrate processing region following formation of the first portion 110 of the carbon-containing layer 114. The effluents of the first precursor 106 may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, however, increased purge time may begin to remove reactive sites, which may reduce uniform formation. Accordingly, in some embodiments the purge may be performed for less than or equal to 60 seconds and may be performed for less than or equal to 50 seconds, less than or equal to 40 seconds, less than or equal to 30 seconds, or less. In some embodiments, a purge gas may be introduced to the substrate processing region to assist in the removal of the effluents. Exemplary purge gases include argon (Ar), helium (He), and nitrogen ($N_2$), among other purge gases.

Figure 1C:
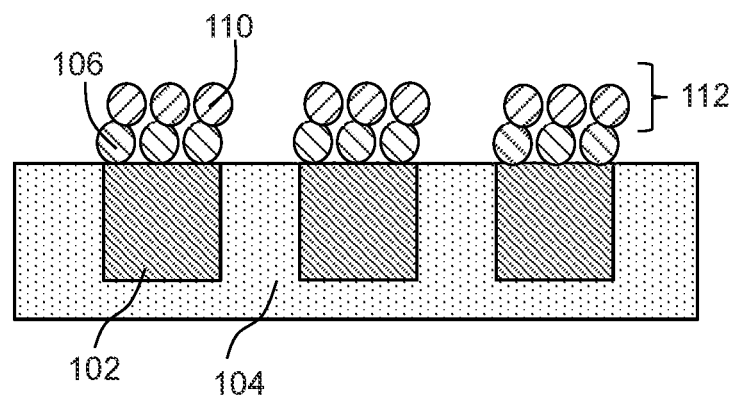
FIG. 1C illustrates cross-section view of a substrate according to one or more embodiments.

Referring to FIG. 1C and FIG. 2, at operation 210, a second type of precursor 110, reacts with the first precursor 106 to form a second portion 112 of carbon-containing layer 114. The second precursor 110 may advantageously have functional groups on one end that increase the thickness of the carbon-containing layer 114.

In one or more embodiments, the second precursor 110 may be a carbon-containing precursor that has at least two reactive groups that can form bonds with unreacted reactive groups of the first precursor 106 that formed the first portion 108 of the carbon-containing layer 114. Molecules of the second precursor 110 react with the unreacted reactive groups of the first precursor 106 to form bonds linking the second precursor 110 molecules to the first precursor 106 molecules. The reactions between the second and first precursor molecules continue until most or all the unreacted reactive groups on the first precursor 106 molecules have reacted with second precursor 110 molecules. A second portion 112 of a carbon-containing layer 114 of the deposition precursors is formed that blocks further reaction between second precursor 110 molecules in the second precursor effluent and the first portion 108 of the carbon-containing layer 114.

The second precursor 110 may comprise any suitable precursor known to the skilled artisan. In one or more embodiments, the second precursor 110 may have a general formula $R^2$—$(Y)_n$ wherein n is an integer in a range of from 1 to 6, and $R^2$ comprises one or more of an alkyl group, an alkenyl group, an aryl, or aromatic group, and a cycloalkyl group. In one or more embodiments, $R^2$ is independently selected from $C_{1-20}$ alkyl. In other embodiments, $R^2$ is from $C_{1-12}$ alkyl. $Y_n$ comprises one or more of a hydroxide group, an aldehyde group, a ketone group, an acid group, an amino group, an isocyanate group, a thiocyanate group, and an acyl chloride group.

Without intending to be bound by theory, it is thought that the second precursor 110 includes a reactive group that can form a covalent bond with a reactive group of the first precursor 106.

Specific examples of second precursor 110 include, but are not limited to, one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-Oxydianiline, tris(2-aminoethyl) amine, and the like.

Referring to FIG. 2, in one or more embodiments, the method 200 also includes an operation 212 to purge or remove the second precursor 110 effluents from the substrate processing region following the formation of the second portion of the carbon-containing layer 114. The effluents may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include argon, helium, and nitrogen, among other purge gases.

In one or more embodiments, the formation rate of the second portion of the carbon-containing layer 114 may also depend on the pressure of the second precursor 110 effluent in the substrate processing region. Exemplary effluent pressures in the substrate processing region may range from about 1 mTorr to about 20 Torr. Additional exemplary ranges include 5 Torr to 15 Torr, and 9 Torr to 12 Torr, among other exemplary ranges.

With reference to FIG. 2, in one or more embodiments of the method 200 there is a determination/decision point 214 of whether a target thickness of the as-deposited carbon-containing layer 114 on the metal surface 102 of the substrate has been achieved following one or more cycles of forming a carbon-containing layer 114 (e.g., following the formation of the first and second portions of a compound layer). If a target thickness of as-deposited carbon-containing layer 114 has not been achieved, another cycle of forming first and second portions of a carbon-containing layer 114 is performed. If a target thickness of as-deposited carbon-containing layer 114 has been achieved, another cycle to form another carbon-containing layer 114 is not started. Exemplary numbers of cycles for the formation of carbon-containing layers may include 1 cycle to 2000 cycles. Additional exemplary ranges for the number of cycles may include 50 cycles to 1000 cycles, and 100 cycles to 750 cycles, among other exemplary ranges.

Accordingly, in one or more embodiments, the method 200 further includes depositing at least one additional carbon-containing layer on the initial carbon-containing layer, where the initial carbon-containing layer and the at least one additional carbon-containing layer form the carbon-containing layer 114 on the metal surface of the substrate.

In one or more embodiments, the selective carbon-containing layer 114 may have any suitable thickness. In one or more embodiments, the thickness of at least 1 nm, or at least 10 nm, or at least 100 nm, or at least 200 nm, or at least 500 nm, or at least 1000 nm. Exemplary ranges of target thickness to discontinue further cycles of forming compound layers include about 10 nm to about 500 nm. Additional exemplary thickness ranges may include about 50 nm to about 300 nm, and 100 nm to about 200 nm, among other exemplary thickness ranges.

Figure 1D:
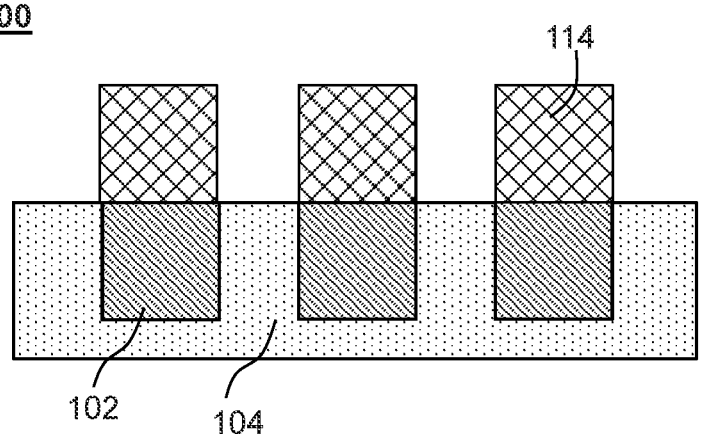
FIG. 1D illustrates cross-section view of a substrate according to one or more embodiments.

In the embodiment shown in method 200 of FIG. 2, the as-deposited carbon-containing layer 114 on the metal surface 102 of the substrate may be optionally post-processed at operation 216, as illustrated in FIG. 1D. The optional post-processing operation 216 can be, for example, a process to modify film properties (e.g., annealing or plasma treatment) or a further film deposition process (e.g., additional ALD or CVD processes) to grow additional films. In some embodiments, the optional post-processing operation 216 can be a process that modifies a property of the deposited film. In some embodiments, the optional post-processing operation 216 comprises annealing the carbon-containing layer 114. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the carbon-containing layer is annealed for a predetermined time in the range of about 15 seconds to about 90 minutes, or in the range of about 1 minute to about 60 minutes. In some embodiments, annealing the as-deposited carbon-containing layer increases the density, decreases the resistivity, and/or increases the purity of the film.

In other embodiments, the carbon-containing layer 114 is subjected to a plasma treatment process at operation 216.

The plasma may comprise one or more of hydrogen ($H_2$), argon (Ar), ammonia ($NH_3$), or oxygen ($O_2$).

In some embodiments, the processing region is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In a time-domain ALD process in some embodiments, exposure to each reactive gas, which includes but not limited to the metal and dielectric material to be used for the ALD film, is separated by a time delay to allow each compound to adhere and/or react on the substrate surface and then be purged from the processing chamber. The reactive gases are prevented from mixing by the purging of the processing chamber between subsequent exposures.

In another aspect of a time-domain ALD process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternatively pulsed with a pulse of purge gas there between multiple times. The purge may also be achieved with a vacuum pump with or without an inert gas.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the carbon-containing layer is deposited, the method may optionally include further processing (e.g., bulk deposition of a dielectric film). In some embodiments, the further processing may be an ALD process.

The disclosure provides that the processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general-purpose computer into a specific purpose computer (controller) that controls the chamber operation such that the processes are performed. The process can be stored on non-transitory computer readable medium including instructions, that, when executed by a controller of a substrate processing chamber, causes the substrate processing chamber to perform the operations of: flow a first precursor over a substrate comprising a metal surface and a non-metal surface to form a first portion of an initial carbon-containing film on the metal surface, the first precursor comprising a first reactive group; remove a first precursor effluent comprising the first precursor from the substrate; flow a second precursor comprising a second reactive group over the substrate to react with the first reactive group to form a second portion of the initial carbon-containing film on the metal surface; remove a second precursor effluent comprising the second precursor from the substrate; and anneal the initial carbon-containing film to form an annealed carbon-containing layer on the metal surface of the substrate and not on the non-metal surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a film, the method comprising:
    flowing a first precursor over a substrate comprising a metal surface and a non-metal surface to form a first portion of a carbon-containing layer on the metal surface, the first precursor comprising a first reactive group, the first precursor comprising one or more of isophthalaldehyde, phthaldialdehyde, 2,6-pyridinedicarboxaldehyde, glutaric dialdehyde, acetonylacetone, acetylacetone, terephthaloyl chloride, 1,3,5-benzenetricarbonyl trichloride, benzene-1,3,5-tricarboxaldehyde, or 1,4-phenylene diisocyanate;
    removing a first precursor effluent comprising the first precursor from the substrate;
    flowing a second precursor comprising a second reactive group over the substrate to react with the first reactive group to form the carbon-containing layer on the metal surface of the substrate and not on the non-metal surface, the second precursor comprising one or more of propane-1,2,3-triamine, or tris(2-aminoethyl) amine; and
    removing a second precursor effluent comprising the second precursor from the substrate.

2. The method of claim 1, further comprising pre-treating the metal surface to form a metal oxide surface on the metal surface.

3. The method of claim 1, further comprising depositing at least one additional carbon-containing layer on the carbon-containing layer, wherein the carbon-containing layer and the at least one additional carbon-containing layer form the carbon-containing layer on the metal surface of the substrate.

4. The method of claim 1, wherein removing the first precursor comprises:
    flowing a purge gas over the substrate; and
    removing a mixture of the first precursor effluent and the purge gas from the substrate.

5. The method of claim 4, wherein the purge gas is selected from argon (Ar), helium (He), and nitrogen ($N_2$).

6. The method of claim 1, further comprising annealing the carbon-containing layer at a temperature in a range of from 100° C. to 600° C.

7. The method of claim 1, further comprising exposing the carbon-containing layer to a plasma treatment.

* * * * *